US010375208B2

(12) United States Patent
Alkkiomäki et al.

(10) Patent No.: US 10,375,208 B2
(45) Date of Patent: Aug. 6, 2019

(54) OPTIMISATION OF INDUSTRIAL DEVICE PARAMETERS IN A COMMUNICATIONS SYSTEM

(71) Applicant: ABB Technology Oy, Helsinki (FI)

(72) Inventors: Olli Alkkiomäki, Helsinki (FI); Teemu Tanila, Espoo (FI); Kalle Suomela, Järvenpää (FI); Ville Särkimäki, Espoo (FI)

(73) Assignee: ABB Schweiz AG, Baden (CH)

( * ) Notice: Subject to any disclaimer, the term of this patent is extended or adjusted under 35 U.S.C. 154(b) by 3 days.

(21) Appl. No.: 15/456,551

(22) Filed: Mar. 12, 2017

(65) Prior Publication Data

US 2017/0272542 A1    Sep. 21, 2017

(30) Foreign Application Priority Data

Mar. 16, 2016  (EP) .................... 16160619

(51) Int. Cl.
*G06F 15/16* (2006.01)
*H04L 29/08* (2006.01)
(Continued)

(52) U.S. Cl.
CPC .............. *H04L 67/34* (2013.01); *G01R 31/40* (2013.01); *G05B 15/02* (2013.01);
(Continued)

(58) Field of Classification Search
CPC ..... H04L 67/34; H04L 67/125; H04L 67/141; G01R 31/40; G05B 15/02; G06K 19/06037
(Continued)

(56) References Cited

U.S. PATENT DOCUMENTS

2007/0115827 A1* 5/2007 Boehnke ................ G08C 17/02
                                                         370/236
2014/0088733 A1  3/2014 Krauskopf et al.
(Continued)

FOREIGN PATENT DOCUMENTS

EP       1369755 A2    12/2003
EP       2824890 A1    1/2015
EP       2837979 A1    2/2015

OTHER PUBLICATIONS

European Search Report, EP16160619, dated Aug. 19, 2016, ABB Technology Oy, 8 pages.

*Primary Examiner* — S M A Rahman
(74) *Attorney, Agent, or Firm* — Taft Stettinius & Hollister LLP; J. Bruce Schelkopf (57) ABSTRACT

A method comprises storing, in an automated power conversion device, operational information on the usage of the automated power conversion device, and information on user-adjustable parameter settings of the automated power conversion device. A local terminal device receives the operational information and the information on the user-adjustable parameter settings from the automated power conversion device, and forwards said information to a remote network node via a communications network. The received information is analyzed in the remote network node, and based on the analysis the remote network node generates a recommendation on an optimal set of user-adjustable parameters regarding the automated power conversion device. The generated recommendation is transmitted from the remote network node and received in the local terminal device.

16 Claims, 4 Drawing Sheets

(51) Int. Cl.
  *G01R 31/40* (2014.01)
  *G05B 15/02* (2006.01)
  *G06K 19/06* (2006.01)

(52) U.S. Cl.
  CPC ...... *G06K 19/06037* (2013.01); *H04L 67/125* (2013.01); *H04L 67/141* (2013.01)

(58) Field of Classification Search
  USPC .......................................................... 709/217
  See application file for complete search history.

(56) References Cited

U.S. PATENT DOCUMENTS

2014/0289321 A1* 9/2014 Fata ....................... G05B 15/02
                                                                  709/203
2015/0054621 A1   2/2015 Lin et al.

* cited by examiner

OPTIMISATION OF INDUSTRIAL DEVICE PARAMETERS IN A COMMUNICATIONS SYSTEM

TECHNICAL FIELD

The invention relates to communications, and particularly to transmitting optimised industrial automation device data between network nodes of a communications system.

BACKGROUND

The following background description art may include insights, discoveries, understandings or disclosures, or associations together with disclosures not known to the relevant art prior to the present invention but provided by the present disclosure. Some such contributions disclosed herein may be specifically pointed out below, whereas other such contributions encompassed by the present disclosure the invention will be apparent from their context.

Frequency converters are used to change the frequency and magnitude of electricity supplied to a load. Frequency converters are being used for example in alternating current (AC) motor drives. In exemplary operation, a frequency converter receives AC current from an electrical power supply and converts the frequency of the received AC current to another frequency, after which the AC current is supplied to an AC electric motor. Also further parameters, for example, a voltage level of the received AC current may be changed. The AC motors are used in various applications including, for example, fans and pumps. In many applications, the use of frequency converters may provide significant energy savings compared to supplying electrical power having a constant frequency.

To facilitate service and maintenance of an industrial automation device, such as a frequency converter, the industrial automation device may be configured to send gathered data to a server for analysis. However, the result of the analysis is only available remotely in the server.

BRIEF DESCRIPTION

The following presents a simplified summary of features disclosed herein to provide a basic understanding of some exemplary aspects of the invention. This summary is not an extensive overview of the invention. It is not intended to identify key/critical elements of the invention or to delineate the scope of the invention. Its sole purpose is to present some concepts disclosed herein in a simplified form as a prelude to a more detailed description.

According to an aspect, there is provided the subject matter of the independent claims. Embodiments are defined in the dependent claims.

One or more examples of implementations are set forth in more detail in the accompanying drawings and the description below. Other features will be apparent from the description and drawings, and from the claims.

Some embodiments provide a method, system, apparatus and a computer program product for communicating automated power conversion device data.

BRIEF DESCRIPTION OF THE DRAWINGS

In the following the invention will be described in greater detail by means of preferred embodiments with reference to the attached drawings, in which.

DETAILED DESCRIPTION OF THE INVENTION

The following embodiments are exemplary. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments. Furthermore, words "comprising" and "including" should be understood as not limiting the described embodiments to consist of only those features that have been mentioned and such embodiments may contain also features/structures that have not been specifically mentioned.

Configuration information on an apparatus may be encoded as an optical code which may be displayed on a display of an apparatus. Condition monitoring of an individual machine may be carried out taking into account data gathered from other similar machines. Sensor data on an environment may be monitored, and the gathered information may be sent remotely to a database for comparison with reference data. In these systems, device data is sent to a server for further analysis. However, the processed information is not sent back to the device.

In an embodiment, it is possible to transfer automation device data from the automation device to a network server, process the automation device data, and send the processed automation device data back to the automation device to optimize the automation device usage.

Optimal gains may be found for an optimization algorithm using data gathered during the operation of the automation device. However, for optimum control of control parameters of the automation device, the data needs to be processed locally, and the optimization algorithm is to be pre-programmed in the automation device. Any changes in the optimization algorithm require reprogramming of the automation device, and the optimization algorithm is also restricted by the computational power of the automation device processing unit.

In an embodiment, it is possible to overcome these requirements/restrictions by the optimization algorithm being run on a remote server.

Figure 1:
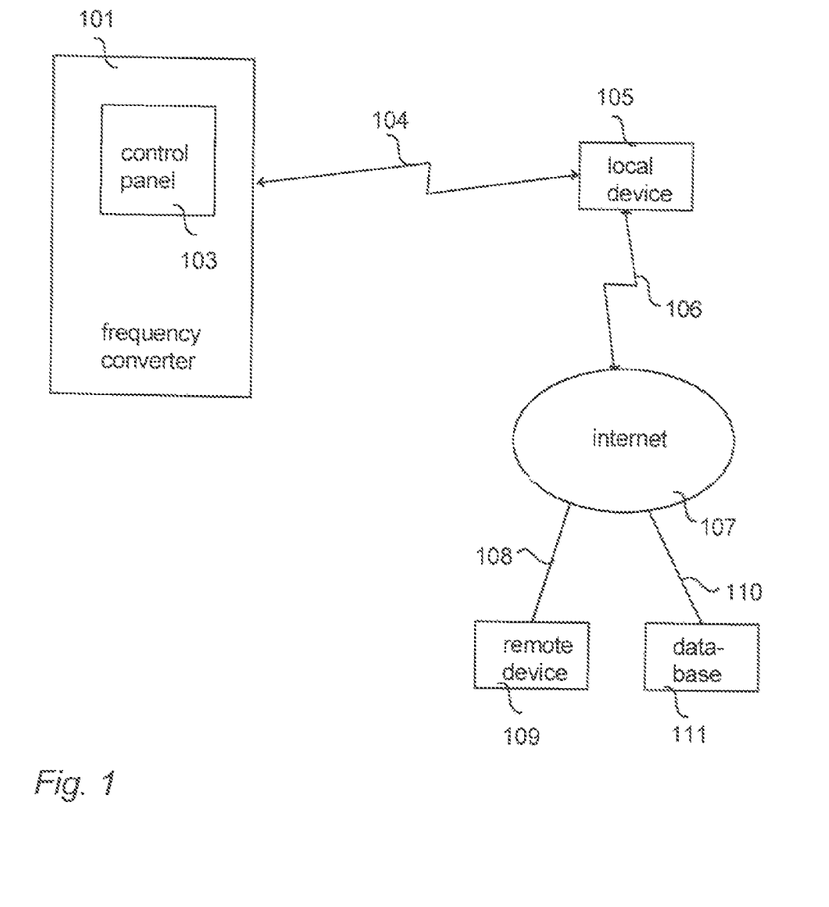
FIG. 1 illustrates a wireless communication system to which embodiments of the invention may be applied.

FIG. 1 illustrates a wireless communication scenario to which embodiments of the invention may be applied. Referring to FIG. 1, an example of a radio system to which embodiments of the invention may be applied, is based on LTE network elements. However, an embodiment is not limited to the LTE radio communications systems but may also be implemented in other radio communications systems, such as 3G, 4G, 5G, LTE-A, UMTS (universal mobile telecommunications system), EDGE, WCDMA, Bluetooth network, WiFi, WLAN or any other mobile or wireless network. In an embodiment, the presented solution may be applied between user equipment belonging to different but compatible systems such as LTE and UMTS.

A general architecture of a communication system is illustrated in FIG. 1. FIG. 1 illustrates a simplified system architecture only showing some elements and functional entities, all being logical units whose implementation may differ from what is shown. The connections shown in FIG. 1 are logical connections; the actual physical connections may be different. It is apparent to a person skilled in the art that the systems also comprise other functions and structures. It should be appreciated that the functions, structures, elements, and protocols used in or for wireless communication are irrelevant to the actual invention. Therefore, they need not be discussed in more detail here.

FIG. 1 illustrates a communication system according to an embodiment. FIG. 1 illustrates an exemplary communications system in which a user terminal 105 is able to connect to the internet 107 and to one or more industrial automation devices such as a frequency converter 101. The user terminal 105 may be a local terminal device (local device) located on-site at a close proximity of the frequency converter 101. The local terminal device 105 may comprise a user equipment such as a smartphone, mobile phone, tablet computer or laptop computer. A connection 106 of the local terminal device 105 to the internet 107 may be provided by a cellular, wireless or wired link. A connection 104 of the local terminal device 105 to the frequency converter 101 may be provided e.g. by a Bluetooth, Bluetooth low energy, WiFi, wireless mesh network, NFC (near field communication), and/or inductive connection (such as an inductive connection according to an inductive power standard (Qi) by the Wireless Power Consortium).

A network apparatus 109 may be a remote device such as a remote terminal device, server and/or database located at a service center, for facilitating service and maintenance of the frequency converter 101. The remote device 109 may facilitate different ways of how to communicate with the frequency converter 101 via the local terminal device 105. The remote device 109 may comprise e.g. a desktop computer, laptop computer, tablet computer, smartphone, mobile phone, server, database, etc. Any suitable technology that makes it possible to store frequency converter optimization information and other frequency converter specific data into a service center database 111 may be utilized. For example, a cloud service (cloud computing) may be used via the internet 107 to store frequency converter optimization information and other frequency converter data into the service center database 111. The local and remote devices may be capable of communicating with each other via the internet 107 by utilizing the cloud service.

Figure 2:
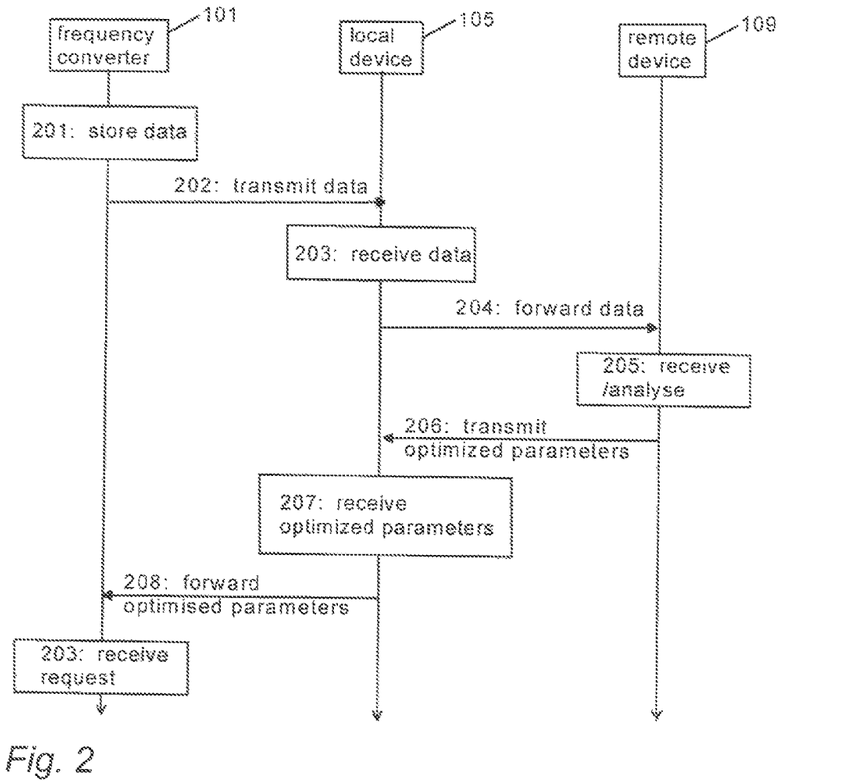
FIG. 2 is a signalling diagram of a procedure for signalling of information related to an industrial automation device according to an embodiment of the invention.

Let us now describe embodiments of the invention with reference to FIG. 2. FIG. 2 is a signalling diagrams illustrating a method for signalling operation and optimisation information on an industrial automation device between the industrial automation device (such as the frequency converter 101), and network nodes (or network apparatuses) of a communication system, such as the local device 105 and/or the remote device 109. The network node may be a terminal device, user equipment, host computer, server computer, base station, access node, database or any other network element. For example, the server computer or the host computer may generate a virtual network through which the host computer communicates with the terminal device.

Referring to FIG. 2, the frequency converter 101 may store (block 201), e.g. in an internal memory of the frequency converter 101, information on user-adjustable parameters (e.g. present values of parameters such as controller gains, ramp times, motor data, limits, magnetization settings, signal filtering settings, motor control settings, etc.) and information recorded during the operation of the frequency converter (e.g. observed performance information such as information on key performance indicators (such as load current histogram, torque ripple, torque vs. speed curves, and/or power vs. speed curves) and/or other information (such as resonance frequencies, load inertias, and/or external information etc.)), regarding the frequency converter and/or the device, process or system the frequency converter is controlling. Said other information may be stored e.g. in the user-adjustable parameters, or the frequency converter may identify, for example, the resonance frequencies automatically and store them to the user-adjustable parameters. The frequency converter 101 is configured to transmit (block 202) the information recorded during the operation of the frequency converter (which may also be referred to as operational information on the usage of the frequency converter) and the information on the user-adjustable parameters to the local terminal device 105 via a communications link 104 established between the frequency converter 101 and the local terminal device 105. The local terminal device 105 is configured to receive (block 203) the information transmitted 202 by the frequency converter 101. Alternatively, the local terminal device 105 is configured to read (blocks 202, 203) said information by scanning a respective QR code from the frequency converter 101.

Based on the receiving/reading 203, the local terminal device 105 is configured forward (block 204) the information on the user-adjustable parameters and the information recorded during the operation of the frequency converter, to the remote device 109 via a communications network 107. The information on the user-adjustable parameters and the information recorded during the operation of the frequency converter is received (block 205) in the remote device 109 from the local terminal device 105. Based on said information, the remote device 109 is configured to analyse (block 205) said information. Based on the analysing, the remote device 109 is configured to generate (block 205) a recommendation on an optimal set of user-adjustable parameters (e.g. recommended values of parameters such as controller gains, ramp times, motor data, limits, magnetization settings, signal filtering settings, and/or motor control settings, etc.) regarding the frequency converter and/or the device, process or system the frequency converter is controlling. Based on the generating, the remote device is configured to transmit (block 206) to the local terminal device said recommendation on the optimal set of the user-adjustable parameters regarding the frequency converter. The local terminal device is configured to receive (block 207) said recommendation from the remote device. After receiving said recommendation in the local terminal device, the local terminal device may be configured to display said recommendation to the user of the local terminal device, wherein the user of the local terminal device may (e.g. manually) update the user-adjustable parameters of the frequency converter according to the recommendation. Alternatively the frequency converter may be configured to forward (block 208) the recommendation including the optimal set of the user-adjustable parameters to the frequency converter, wherein the frequency converter is configured to update (block 209) said parameters according to the recommendation received (block 209) in the frequency converter.

Herein, the communications link established between the local terminal device 105 and the frequency converter 101 may comprise a wireless communications link 104 such as a Bluetooth connection, inductive connection, wired connection, and/or near field communication (NFC) connection. Alternatively or in addition to that, the local terminal device 105 may be configured to read the information stored in the frequency converter, such that the local terminal device comprises a QR (quick response) code scanner configured to scan a QR code generated by the frequency converter 101 based on the information (such as the information on the user-adjustable parameters and the information recorded during the operation of the frequency converter) and displayed by the frequency converter. Thus, by scanning the QR code, said information regarding the frequency converter may be obtained in the local terminal device.

In an embodiment, the industrial automation device such as a frequency converter is configured to send information on user-adjustable parameters and data gathered during device usage to a remote device such as a database or server. The remote device is configured to analyse the information and, based on the analysing, send a recommendation on optimal parameters to a user device such as a mobile terminal. The industrial automation device may be connected to the server/database using an internet connection via the mobile terminal.

In the industrial automation device, the user may adjust various parameters affecting the performance, energy efficiency and safety of the industrial automation device (and the device, process and/or system the industrial automation device is controlling). Finding optimal parameters for an application requires detailed knowledge on the device, process and/or system the frequency converter is controlling, and experience on how to tune the parameters. The frequency converter records key performance indicators (KPI) (load current histogram, torque ripple, torque vs. speed curves, power vs. speed curves, etc.) of the drive system and estimates system parameter information (resonance frequencies, load inertias, etc.) of the drive train. In an embodiment, the user terminal is configured to read the recorded information and modified parameters and send them to a database (and/or server) for further analysis. Based on the analysis results, a recommendation of optimal parameters is sent back to the user terminal. The user terminal may be connected to the database, for example, by using an internet connection between the database and the user terminal.

In an embodiment, sensors of the mobile terminal may give additional information to assist in the optimization process. A sensor may include, for example, a microphone, camera, accelerometer, magnetometer, gyroscope, temperature sensor, humidity sensor, and/or pressure sensor for sensoring (physical) operational/environmental conditions of the device, process and/or system the industrial automation device is controlling. The mobile terminal may be configured to record data from its sensors and send the recorded data to the database along with the data read from the automation device. The data recorded from different sources may be synchronized in the database/server. Thus, the local terminal device may obtain, from the sensor of the local terminal device, sensory information on the physical conditions recorded by the sensor in the proximity of the local terminal device (i.e. within the sensing range of the sensor). The sensory information is forwarded from the local terminal device to the remote network node via the communications network. The remote network node receives the sensory information in from the local terminal device. The received sensory information may be utilized, in the remote network node, as additional information for the generating of the recommendation on the optimal set of the user-adjustable parameters regarding the automated power conversion device.

In an embodiment, the data analysis in the server may include using system identification information for optimizing PID controller parameters and/or tuning the oscillation damping settings of the frequency converter, for example.

In an embodiment, expert systems may be adopted to assure that the optimized parameters follow a given set of rules. For example, in a pump application the speed limits may be set so that the pump never runs in an opposite direction.

In an embodiment, data mining techniques may be utilized. A multivariate probability density function (PDF) of the application parameters and KPIs may be formed based on the data gathered from other devices previously connected to the database. If the user-adjustable parameters are not consistent with the probability density function, a suggestion is made to change a set of parameters to conform the probability density function.

In an embodiment, the optimization procedure may be iterative so that after updating a set of optimized parameters the user is advised to let the device/process/system run for a while with the optimised parameters. Then newly recorded information obtained in the automation device is sent via the mobile device to the database to further tune the parameters. Also when the operation conditions of the device/process/system change due to wear or changes in the operation environment the user may decide that the optimization procedure is to be performed again.

In an embodiment, for optimizing the parameters the automation device is configured to record process information and device information, and the automation device may be configured to send the recorded process information and device information and user-modified parameters to the database or server. The process information and device information is received and analysed in the database or server, and based on the analysing, an optimal set of parameters is generated. The generated optimal set of parameters is sent back to the user (to the mobile device) and they are updated either manually by the user or automatically in the automation device.

Figure 3:
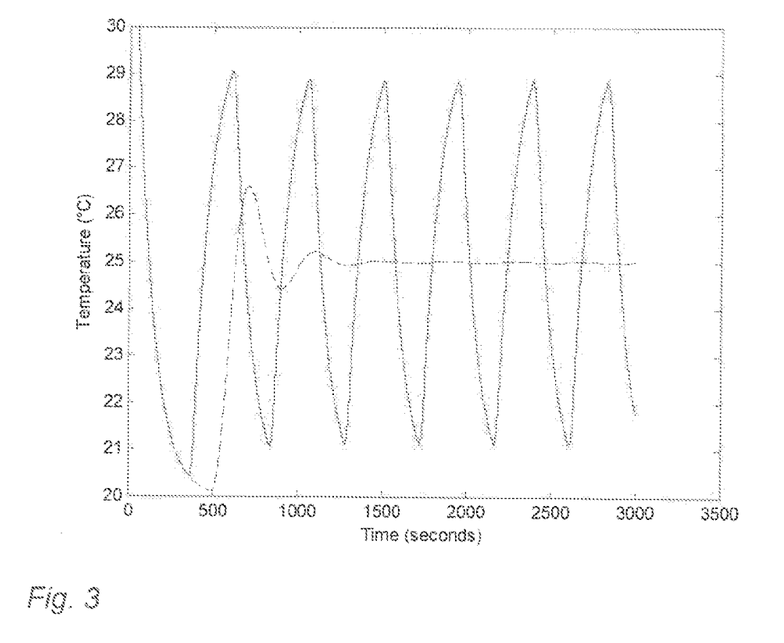
FIG. 3 illustrates exemplary process variable measurement.
Figure 4:
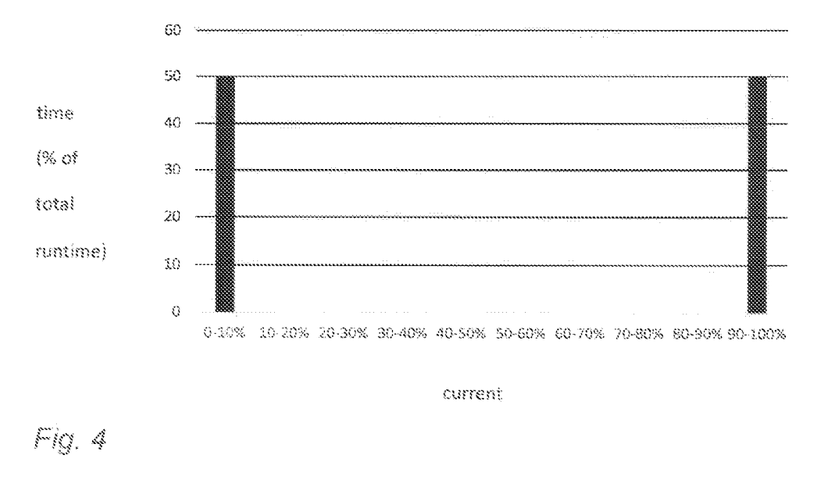
FIG. 4 illustrates an exemplary current histogram for a motor.

FIG. 3 (solid line) illustrates an exemplary fan application, wherein the electric motor of the fan is controlled by an automation device. In FIG. 3, the temperature of the electric motor of the fan is illustrated as a function of time, and the application is poorly set, such that latency in process variable measurement causes oscillation in the process through a feedback loop. The I (integral) part of the process PID (proportional integral derivative) controller is set too high causing a large overshoot. The current limit of the electric motor is reached, and the PID controller saturates. Then, as there is a large delay in the process variable measurement, the feedback loop reacts too late and the PID controller saturates in an opposite direction. The PID controller becomes an on-off controller, and the process oscillates about the set-point. The oscillations are visible in the process variable measurement (FIG. 3, solid line). The PID controller saturation is illustrated in a motor current histogram in FIG. 4, where x-axis represents current, and y-axis represents time (percent of total run time). The automation device operates at the maximum current for half of the time and at minimum current for the rest of the time. The current histogram and user-modified parameters may be sent to the database for analysis. When compared to the data gathered from other similar applications, it may be seen that the current histogram of the motor is abnormal. Also, from the user-modified parameters it may be observed that the process PID controller is in use. In the analysis result, the user is advised to tune the process PID parameters by reducing the I part. The dashed line in FIG. 3 shows that the oscillations fade away quickly when the I part is reduced.

In an embodiment, the local terminal device may store the recommendation in its internal memory. Then, the recommendation may be displayed by the local terminal device and/or provided to the automation device.

An embodiment provides a system comprising an automation device 101 which is equipped with a short range radio interface, e.g. Bluetooth or WiFi. The radio interface may be in the automation device 101 or in a control panel 103 of the automation device 101. The mobile device 105 may operate as a mobile router that routes data between the short range wireless radio network 104 and the internet-connected IP based network 107, for example, 3G, 4G, WiFi. The remote device 109 may be connected to the internet 107 by using Ethernet, WiFi or some other network interface.

In an embodiment, the mobile device may start the application in the mobile device in response to an act by the user. The mobile device may read the frequency converter information from the frequency converter by using data transfer means of the mobile device (cable, optical, acoustic or radio transfer). The information may include operational data on the frequency converter. The information may also include other information, such as information on user-adjustable frequency converter parameters. Based on the information, the mobile device may obtain, from a remote device such as a network database or server, frequency converter related optimization information (such as a recommendation on optimal frequency converter parameter settings). Based on the obtaining, the mobile device may be configured to automatically display the user-adjustable parameter settings included in the recommendation, and/or the user-adjustable parameter settings included in the recommendation may be updated on the frequency converter automatically, or manually by the user.

In addition to a drive system/frequency converter, the embodiments are also applicable to other automated power conversion devices such as AC/DC modules, DC/AC modules, DC/DC modules, programmable logic controllers (PLC), switches, motion controllers, motion drives, servo motors, soft starters, robotics, cars, heavy equipment, and/or any other devices used for industrial automation.

Figure 5:
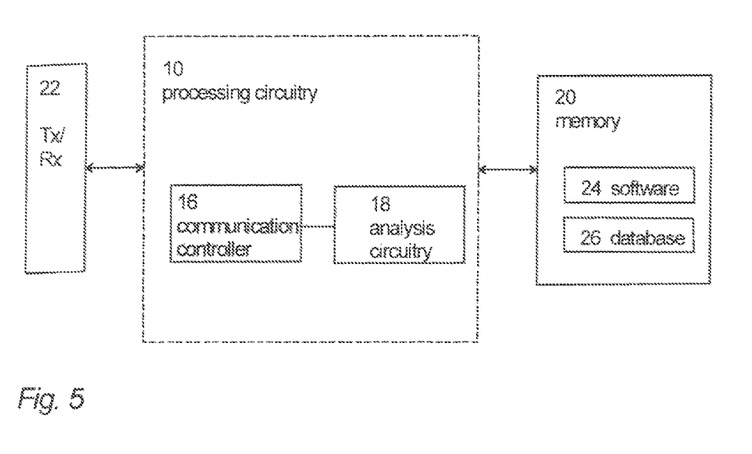
FIG. 5 is a block diagram illustrating an exemplary apparatus.

An embodiment provides an apparatus comprising at least one processor and at least one memory including a computer program code, wherein the at least one memory and the computer program code are configured, with the at least one processor, to cause the apparatus to carry out the procedures of the above-described automated power conversion device, local terminal device or remote device. FIG. 5 is a block diagram illustrating such an apparatus. The at least one processor, the at least one memory, and the computer program code may thus be considered as an embodiment of means for executing the above-described procedures of the device. The apparatus may be comprised in the device, e.g. the apparatus may form a chipset or a circuitry in the device. In some embodiments, the apparatus is the device. The apparatus comprises a processing circuitry 10 comprising the at least one processor. The processing circuitry may comprise a communications controller 16 configured to obtain operational information related to the automated power conversion device. The processing circuitry 10 may further comprise an analysis circuitry 18 configured to obtain information on optimal parameters of the automated power conversion device.

The processing circuitry 10 may comprise the circuitries 16, 18 as sub-circuitries, or they may be considered as computer program modules executed by the same physical processing circuitry. The memory 20 may store one or more computer program products 24 (software) comprising program instructions that specify the operation of the circuitries. The memory 20 may further store a database 26 comprising automated power conversion device operational data and user-adjustable parameters, for example. The apparatus may further comprise an interface 22 (transmitter/receiver Tx/Rx) providing the apparatus with communication capability with network nodes.

As used herein, the term 'circuitry' refers to all of the following: (a) hardware-only circuit implementations such as implementations in only analog and/or digital circuitry; (b) combinations of circuits and software and/or firmware, such as (as applicable): (i) a combination of processor(s) or processor cores; or (ii) portions of processor(s)/software including digital signal processor(s), software, and at least one memory that work together to cause an apparatus to perform specific functions; and (c) circuits, such as a microprocessor(s) or a portion of a microprocessor(s), that require software or firmware for operation, even if the software or firmware is not physically present.

This definition of 'circuitry' applies to all uses of this term in this application. As a further example, as used herein, the term "circuitry" would also cover an implementation of merely a processor (or multiple processors) or portion of a processor, e.g. one core of a multi-core processor, and its (or their) accompanying software and/or firmware. The term "circuitry" would also cover, for example and if applicable to the particular element, a baseband integrated circuit, an application-specific integrated circuit (ASIC), and/or a field-programmable grid array (FPGA) circuit for the apparatus according to an embodiment of the invention.

The processes or methods described above in connection with FIGS. 1 to 5 may also be carried out in the form of one or more computer process defined by one or more computer programs. The computer program shall be considered to encompass also a module of a computer programs, e.g. the above-described processes may be carried out as a program module of a larger algorithm or a computer process. The computer program(s) may be in source code form, object code form, or in some intermediate form, and it may be stored in a carrier, which may be any entity or device capable of carrying the program. Such carriers include transitory and/or non-transitory computer media, e.g. a record medium, computer memory, read-only memory, electrical carrier signal, telecommunications signal, and software distribution package. Depending on the processing power needed, the computer program may be executed in a single electronic digital processing unit or it may be distributed amongst a number of processing units.

The present invention is applicable to cellular or mobile communication systems defined above but also to other suitable communication systems. The protocols used, the specifications of cellular communication systems, their network elements, and terminal devices develop rapidly. Such development may require extra changes to the described embodiments. Therefore, all words and expressions should be interpreted broadly and they are intended to illustrate, not to restrict, the embodiment.

It will be obvious to a person skilled in the art that, as the technology advances, the inventive concept can be implemented in various ways. The invention and its embodiments are not limited to the examples described above but may vary within the scope of the claims.

The invention claimed is:

1. A method of communicating automated power conversion device data in a communications system, the method comprising:

storing, in an automated power conversion device, operational information on the usage of the automated power conversion device, and information on user-adjustable parameter settings of the automated power conversion device;

receiving, in a local terminal device, the operational information and the information on the user-adjustable parameter settings from the automated power conversion device;

forwarding the operational information and the information on the user-adjustable parameter settings from the local terminal device to a remote network node via a communications network;

receiving the operational information and the information on the user-adjustable parameter settings in the remote network node from the local terminal device;

analysing the received operational information and the information on the user-adjustable parameter settings in the remote network node;

based on the analysing, generating in the remote network node a recommendation on an optimal set of user-adjustable parameters regarding the automated power conversion device;

transmitting, from the remote network node to the local terminal device, the generated recommendation on the optimal set of the user-adjustable parameters via the communications network;

receiving the recommendation in the local terminal device from the remote network node;

obtaining, in a local terminal device from a sensor of the local terminal device, sensory information on physical conditions recorded by the sensor in the proximity of the local terminal device;

forwarding the sensory information from the local terminal device to the remote network node via the communications network;

receiving the sensory information in the remote network node from the local terminal device; and utilizing, in the remote network node, the received sensory information as additional information for the generating of the recommendation on the optimal set of the user-adjustable parameters regarding the automated power conversion device;

wherein the optimal set of user-adjustable parameters is iteratively updated after running the automated power conversion device with the optimal set of user-adjustable parameters, or wherein a new optimal set of user-adjustable parameters is generated due to wear or change in operation environment.

2. The method according to claim 1, wherein the operational information on the usage of the automated power conversion device and the information on user-adjustable parameter settings of the automated power conversion device is transmitted from the automated power conversion device to the local terminal device, via a communication link established between the local terminal device and the automated power conversion device.

3. The method according to claim 1, wherein the operational information on the usage of the automated power conversion device and the information on the user-adjustable parameter settings of the automated power conversion device is received in the local terminal device in response to the local terminal device scanning a corresponding QR code generated by the automated power conversion device based on said information and displayed on the automated power conversion device.

4. The method according to claim 1, wherein the operational information on the usage of the automated power conversion device and the information on user-adjustable parameter settings of the automated power conversion device is transmitted from the automated power conversion device to the local terminal device periodically, in response to establishing a communication link between the local terminal device and the automated power conversion device, or in response to a request from the local terminal device.

5. The method according to claim 1, wherein the method comprises informing the user of the local terminal device of the optimal set of the user-adjustable parameters regarding the automated power conversion device by displaying said recommendation in the local terminal device, in order the user of the local terminal device to be able to manually update the user-adjustable parameters of the automated power conversion device according to the recommendation.

6. The method according to claim 1, wherein the method comprises forwarding said recommendation including the optimal set of the user-adjustable parameters from the local terminal device to the automated power conversion device;

receiving said recommendation in the automated power conversion device;

automatically updating the user-adjustable parameters in the automated power conversion device according to the received recommendation.

7. The method according to claim 1, wherein the operational information on the usage of the automated power conversion device comprises observed performance information regarding the automated power conversion device or a device controlled by the automated power conversion device, and the information on the user-adjustable parameter settings of the automated power conversion device comprises present parameter values regarding the automated power conversion device or the device controlled by the automated power conversion device.

8. The method according to claim 1, wherein the optimal set of the user-adjustable parameters regarding the automated power conversion device comprises recommended parameter values regarding the automated power conversion device or a device controlled by the automated power conversion device.

9. The method according to claim 1, wherein the automated power conversion device comprises a frequency converter, drive system, AC/DC modules, DC/AC module, DC/DC module, programmable logic controller, switch, motion controller, motion drive, servo motor, soft starter, robotics device, car, heavy equipment or some other industrial automation device.

10. The method according to claim 1, wherein the sensor of the local terminal device comprises at least one of a microphone, camera, accelerometer, magnetometer, gyroscope, temperature sensor, humidity sensor and pressure sensor.

11. The communications system comprising:
an automated power conversion device configured to store operational information on the usage of the automated power conversion device, and information on user-adjustable parameter settings of the automated power conversion device;
a local terminal device configured to receive the operational information and the information on the user-adjustable parameter settings from the automated power conversion device;
wherein the local terminal device is configured to forward the operational information and the information on the user-adjustable parameter settings to a remote network node via a communications network;
wherein the remote device is configured to
receive the operational information and the information on the user-adjustable parameter settings from the local terminal device;
analyse the received operational information and the information on the user-adjustable parameter settings;
based on the analysing, generate a recommendation on an optimal set of user-adjustable parameters regarding the automated power conversion device; and
transmit, to the local terminal device, the generated recommendation on the optimal set of the user-adjustable parameters via the communications network;
wherein the local terminal device is configured to
receive the recommendation from the remote network node;
obtain from a sensor of the local terminal device, sensory information on
physical conditions recorded by the sensor in the proximity of the local terminal device;
forward the sensory information to the remote network node via the communications network;
wherein the remote device is configured to
receive the sensory information from the local terminal device; and
utilize the received sensory information as additional information for the generating of the recommendation on the optimal set of the user-adjustable parameters regarding the automated power conversion device;
wherein the optimal set of user-adjustable parameters is iteratively updated after running the automated power conversion device with the optimal set of user-adjustable parameters, or
wherein a new optimal set of user-adjustable parameters is generated due to wear or change in operation environment.

12. The system according to claim 11, wherein the system is configured to forward said recommendation including the optimal set of the user-adjustable parameters from the local terminal device to the automated power conversion device;
receive said recommendation in the automated power conversion device; and
automatically update the user-adjustable parameters in the automated power conversion device according to the received recommendation.

13. An apparatus comprising:
at least one processor; and
at least one memory including a computer program code, wherein the at least one memory and the computer program code are configured, with the at least one processor, to cause the apparatus to
receive, from an automated power conversion device, operational information on the usage of the automated power conversion device, and information on user-adjustable parameter settings of the automated power conversion device;
forward the operational information and the information on the user-adjustable parameter settings to a remote network node via a communications network;
receive, from the remote network node, a recommendation on an optimal set of the user-adjustable parameters via the communications network, the optimal set of the user-adjustable parameters being generated in the remote network node based on the operational information and the information on the user-adjustable parameter settings;
obtain from a sensor of the apparatus, sensory information on physical conditions recorded by the sensor in the proximity of the apparatus;
forward the sensory information to the remote network node via the communications network, the sensory information being utilized in the remote network node as additional information for the generating of the recommendation on the optimal set of the user-adjustable parameters regarding the automated power conversion device;
wherein the optimal set of user-adjustable parameters is iteratively updated after running the automated power conversion device with the optimal set of user-adjustable parameters, or
wherein a new optimal set of user-adjustable parameters is generated due to wear or change in operation environment.

14. The apparatus according to claim 13, wherein it comprises a terminal device of a communications system.

15. The apparatus according to claim 13, wherein the sensor of the apparatus comprises at least one of a microphone, camera, accelerometer, magnetometer, gyroscope, temperature sensor, humidity sensor and pressure sensor.

16. A computer program product embodied on a non-transitory medium readable by a computer and comprising instructions which, when loaded into an apparatus and executed are operable to communicate automated power conversion device data in a communications system, comprising:
store, in an automated power conversion device, operational information on the usage of the automated power conversion device, and information on user-adjustable parameter settings of the automated power conversion device;
receive, in a local terminal device, the operational information and the information on the user-adjustable parameter settings from the automated power conversion device;
forward the operational information and the information on the user-adjustable parameter settings from the local terminal device to a remote network node via a communications network;
receive the operational information and the information on the user-adjustable parameter settings in the remote network node from the local terminal device;
analyse the received operational information and the information on the user-adjustable parameter settings in the remote network node;
based on the analyse, generate in the remote network node a recommendation on an optimal set of user-adjustable parameters regarding the automated power conversion device;

transmit, from the remote network node to the local terminal device, the generated recommendation on the optimal set of the user-adjustable parameters via the communications network;

receive the recommendation in the local terminal device from the remote network node;

obtain, in a local terminal device from a sensor of the local terminal device, sensory information on physical conditions recorded by the sensor in the proximity of the local terminal device;

forward the sensory information from the local terminal device to the remote network node via the communications network;

receive the sensory information in the remote network node from the local terminal device; and utilize, in the remote network node, the received sensory information as additional information for the generation of the recommendation on the optimal set of the user-adjustable parameters regarding the automated power conversion device;

wherein the optimal set of user-adjustable parameters is iteratively updated after running the automated power conversion device with the optimal set of user-adjustable parameters, or wherein a new optimal set of user-adjustable parameters is generated due to wear or change in operation environment.

\* \* \* \* \*